US010356736B2

(12) United States Patent
Reinhardt et al.

(10) Patent No.: US 10,356,736 B2
(45) Date of Patent: Jul. 16, 2019

(54) CIRCUIT ARRANGEMENT FOR CLOCK SYNCHRONIZATION

(71) Applicant: Intel IP Corporation, Santa Clara, CA (US)

(72) Inventors: Steffen Reinhardt, Nuremberg (DE); Peter Bode, Munich (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/600,862

(22) Filed: May 22, 2017

(65) Prior Publication Data

US 2017/0367060 A1 Dec. 21, 2017

(30) Foreign Application Priority Data

Jun. 21, 2016 (DE) .......................... 10 2016 111 297

(51) Int. Cl.
| | |
|---|---|
| *H04W 56/00* | (2009.01) |
| *H03M 1/00* | (2006.01) |
| *H04L 12/18* | (2006.01) |
| *H04W 4/10* | (2009.01) |
| *H04W 24/02* | (2009.01) |

(52) U.S. Cl.
CPC ......... *H04W 56/001* (2013.01); *H03M 1/001* (2013.01); *H04L 12/189* (2013.01); *H04W 4/10* (2013.01); *H04W 24/02* (2013.01); *H04W 56/003* (2013.01); *H04W 56/005* (2013.01); *H04W 56/0035* (2013.01); *H04W 56/0055* (2013.01)

(58) Field of Classification Search
CPC ..................................................... H04L 12/189
See application file for complete search history.

(56) References Cited

U.S. PATENT DOCUMENTS

| | | | |
|---|---|---|---|
| 5,513,209 A | 4/1996 | Holm | |
| 5,796,777 A * | 8/1998 | Terlep | ................... H04B 7/082 375/227 |
| 9,231,562 B2 | 1/2016 | Tinker | |
| 2004/0213123 A1 | 10/2004 | Takahashi et al. | |

(Continued)

OTHER PUBLICATIONS

Wikipedia, "Phasenregelschleife", https://de.wikipedia.org/wiki/Phasenregelschleife, retrieved on May 22, 2017.

(Continued)

*Primary Examiner* — Hsinchun Liao
(74) *Attorney, Agent, or Firm* — Viering, Jentschura & PartnermbB

(57) ABSTRACT

A circuit arrangement may include an analog-to-digital-converter (ADC) configured to convert an analog signal into a digitized signal having an ADC frequency, a decimation circuit configured to provide a first signal having a sampling frequency based on the digitized radio signal having the ADC frequency. The sampling frequency is smaller than the ADC frequency. The circuit arrangement may further include a timer circuit providing a second signal having a timer frequency and a timing control signal to control the timing of the decimation circuit, and a difference determination circuit configured to determine a phase difference between the second signal and the first signal.

16 Claims, 7 Drawing Sheets

(56) References Cited

U.S. PATENT DOCUMENTS

2007/0236376 A1* 10/2007 Kozak .................. H03M 3/498
341/143
2014/0101218 A1* 4/2014 Tinker ............... H03H 17/0671
708/313

OTHER PUBLICATIONS

German Office Action based on Application No. 10 2016 111 297.6(11 Pages) dated Mar. 17, 2017 (Reference Purpose Only).

* cited by examiner

CIRCUIT ARRANGEMENT FOR CLOCK SYNCHRONIZATION

CROSS-REFERENCE TO RELATED APPLICATION

This application claims priority to German Patent Application Serial No. 10 2016 111 297.6, which was filed Jun. 21, 2016, and is incorporated herein by reference in its entirety.

TECHNICAL FIELD

Various embodiments relate generally to a circuit arrangement.

BACKGROUND

Each mobile radio communication terminal device such as a user equipment (UE) in a cellular system needs to be aware of the cellular timing (in other words of the timing of the transmission of radio signals e.g. from a base station, e.g. a NodeB or eNodeB), which is normally derived from the timing of a received radio signal. Therefore, a timer is usually provided in the UE system maintaining the cell-time. This is especially true in time periods in which no radio signal reception takes place in a UE such as a time period in which the UE is in Radio Resource Control (RRC) IDLE mode, e.g. in RRC Discontinuous Reception (DRX), etc. In a situation in which the radio signal reception is ongoing, the timer frequency and the sampling frequency should be aligned. Any drift between the timer and the sampling frequency may cause call-drops.

In a conventional cellular system, there is usually a fixed coupling between timer and sampling frequency and the frequency corrections are applied to a reference frequency, which simultaneously corrects the timer and the sampling.

This is different in cellular system with a so-called free-running reference, which is used for sharing frequency between several wireless systems or even within one single cellular modem in one UE between different Subscriber Identity Modules (SIMs). In a free-running system, the timer and the sampling might be corrected separately, leading to critical error accumulation in the long run.

Another problem may arise if the sampling frequency is derived from the radio frequency (RF) directly and varying heavily with the carrier frequency. In this case it would cost high hardware (HW) effort to keep sampling and timer frequencies identical.

SUMMARY

A circuit arrangement may include an analog-to-digital-converter configured to convert an analog signal into a digitized signal having an analog-to-digital converter frequency, a decimation circuit configured to provide a first signal having a sampling frequency based on the digitized radio signal having the analog-to-digital converter frequency. The sampling frequency is smaller than the analog-to-digital converter frequency. The circuit arrangement may further include a timer circuit providing a second signal having a timer frequency and a timing control signal to control the timing of the decimation circuit, and a difference determination circuit configured to determine a phase difference between the second signal and the first signal.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
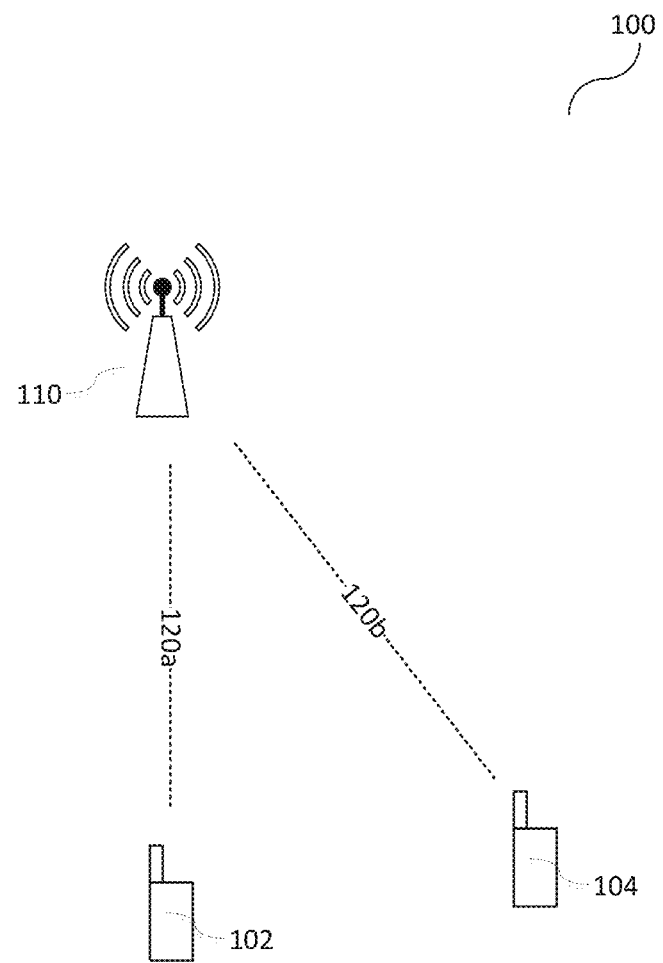
FIG. 1 shows a mobile radio communication network.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

In an aspect of this disclosure, a "circuit" may be understood as any kind of a logic implementing entity, which may be hardware, software, firmware, or any combination thereof. Thus, in an aspect of this disclosure, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be software being implemented or executed by a processor, e.g. any kind of computer program, e.g. a computer program using a virtual machine code such as, e.g. Java. Any other kind of implementation of the respective functions which will be described in more detail below may also be understood as a "circuit" in accordance with an aspect of this disclosure.

The terms "coupling" or "connection" are intended to include a direct "coupling" or direct "connection" as well as an indirect "coupling" or indirect "connection" respectively.

The term "protocol" is intended to include any piece of software and/or hardware, that is provided to implement part of any layer of the communication definition. "Protocol" may include the functionality of one or more of the following layers: physical layer (layer 1), data link layer (layer 2), network layer (layer 3), or any other sub-layer of the mentioned layers or any upper layer.

The communication protocol layers and its respective entities which will be described in the following may be implemented in hardware, in software, in firmware, or partially in hardware, and/or partially in software, and/or partially in firmware. In an aspect of this disclosure, one or more communication protocol layers and its respective entities may be implemented by one or more circuits. In an aspect of this disclosure, at least two communication protocol layers may be commonly implemented by one or more circuits.

Unless explicitly specified, the terms "transmit" and "send" encompass both direct and indirect transmission/sending. Similarly, the term "receive" encompasses both direct and indirect reception unless explicitly specified. As utilized herein, the term "derived from" designates being obtained directly or indirectly from a specific source. Accordingly, data derived from a source includes data obtained directly from the source or indirectly from the source (e.g. through one or more secondary agents).

As used herein, a "cell" in the context of telecommunications may be understood as a sector served by a base station, e.g. an eNodeB. Accordingly, a cell may be a set of geographically co-located antennas that correspond to a particular sectorization of a base station. A base station may thus serve one or more "cells" (or sectors), where each cell is characterized by a distinct communication channel. Furthermore, the term "cell" may be utilized to refer to any of a macrocell, microcell, femtocell, picocell, etc.

Although various aspects of this disclosure are described in connection with a Universal Mobile Telecommunications System (UMTS) mobile radio communications network, it is to be noted that this should not be considered limiting. Various aspects of this disclosure may also be applied in any mobile radio communications network in which a similar scenario as described in the following may occur such as Long Term Evolution (LTE) or LTE Advanced (LTE-A), CDMA 2000, and the like.

Various aspects of this disclosure illustratively give up the fixed coupling of timer frequency and sampling frequency and instantiate an additional control loop which is detecting and correcting drifts between timer frequency and sampling frequency (e.g. in frequency and/or in phase).

A control loop sensor may be provided and may be established by a sample counter and a snapshot unit which takes periodic snapshots of the sample counter under control of the timer. Software (SW) modules may determine the drift between sampling and timing on the basis of the known snapshot time instants and the observed sample counter values. The drift observations may be filtered and may control a Fractional Sample Rate Converter (FSRC) (which will also be referred to as a fractional decimation circuit in the following) such that the drift may be reduced or even removed. Alternatively, the drift can be compensated by shifting timer events accordingly.

If high accuracy is required, as it is the case in Universal Mobile Telecommunications System (UMTS), the sample counter may be replaced by a Numerically Controlled Oscillator (NCO) with sub-sample resolution. The data path of a mobile radio cellular receiver usually includes an FSRC with an inherent NCO by default. The FSRC may be designed such that its NCO also acts as a sensor and a drift correction unit. Further, averaging techniques may be applied to increase accuracy.

In various aspects of this disclosure, hardware (HW) complexity may be reduced, because there may be no special measure necessary to secure identical frequencies for timer and sampling, since this is taken care of by components or modules which may be implemented in software (SW). Non-deterministic effects may be compensated as well with the same mechanisms. These effects may mainly be caused by mis-aligned updates of the sampling frequency and the timer frequency.

Illustratively, a clock synchronization may be provided e.g. in a mobile radio communication device, which includes a free-running oscillator, an analog-to-digital-converter (ADC), a decimation circuit down converting the sampling rate of the signal provided by the analog-to-digital converter, and optionally a baseband circuit. The baseband circuit may be configured to receive the downconverted signal from the decimation circuit. In an implementation, the baseband circuit may be configured to process the received signal only in an appropriate manner in case the signal received from the decimation circuit has a fixed predefined sampling rate. The mobile radio communication device may further include a timer circuit providing a signal e.g. enabling/disabling the decimation circuit. The signal may be generated using a comparator and a counter. The counter may be clocked by a timer clock signal having a timer frequency. In order to ensure that the signal which the baseband circuit receives from the decimation circuit has the desired sampling rate even in case of the free-running oscillator, a control loop may be provided that is configured to control or adjust a phase difference between the timer clock signal and the signal, the decimation circuit applies to the baseband circuit, to a predefined value.

By way of example, an RF receiver of a mobile radio (terminal) communication device such as a UE may be time multiplexed between reception of a serving mobile radio cell and a monitoring mobile radio cell. When a baseband modem of the mobile radio (terminal) communication device such as a UE resumes on the serving mobile radio cell, it expects that the sampling grid was maintained coherently. However, a problem of a sampling grid shift after monitoring may occur. Various aspects of this disclosure may align the sampling grid to a symbol timing for the baseband modem. If the sampling grid is, however, shifted after monitoring, the baseband modem may encounter a symbol time shift. Depending on the time shift, the tracking loop of the mobile radio (terminal) communication device may unlock, throughput may drop or even an established communication connection (e.g. an ongoing call) may drop.

FIG. 1 shows mobile (radio) communication network 100, which includes one or more (radio) base stations, e.g. one or more NodeBs 110, and a plurality of mobile (radio) terminals (also referred to a mobile radio communication terminal devices) 102, 104. Each of mobile terminals 102 and 104 may be served by a first mobile radio cell of base station 110, where base station 110 may be composed of one or more mobile radio cells (not explicitly shown denoted in FIG. 1), e.g. of one or more macrocells. Mobile communication network 100 may be e.g. a UMTS communication network or an LTE (Long Term Evolution) communication network (e.g. in accordance with LTE version 8, version 9, version 10, etc.). Furthermore, mobile communication network 100 may be e.g. an LTE-A (Long Term Evolution Advanced) communication network. However, it is understood that the description provided herein is considered applicable to various other mobile communication technologies, both existing and not yet formulated, e.g. cases where such mobile communication technologies share similar features as disclosed regarding the following examples. As mentioned above, one or more repeaters (not shown) may be provided in the connection path between base station 110 and mobile terminals 102 and 104, which may result in a change of the delay of a signal that mobile terminals 102 and 104 receive via a repeater as compared to the timing of a signal that mobile terminals 102 and 104 receive directly from base station 110.

As mentioned above, the repeater(s) may receive the UMTS signal, may amplify it and may re-transmit it on exactly the same carrier frequency as a NodeB. The signal processing in the repeater(s) thus usually introduce(s) a delay in the signal.

Figure 2:
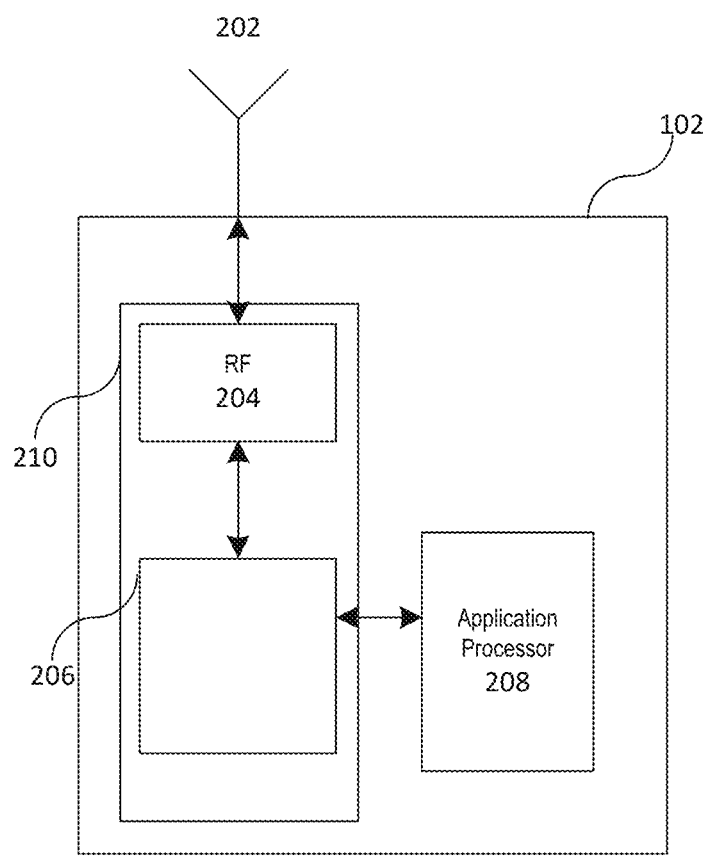
FIG. 2 shows an internal configuration of a mobile radio communication terminal device.

FIG. 2 shows a block diagram illustrating an internal configuration of mobile terminal 102 according to an aspect of the disclosure. Mobile terminal 104 may be configured in a similar manner.

As illustrated in FIG. 2, mobile terminal 102 may include antenna arrangement 202 (which may include one or more antennas, e.g. MIMO (Multiple-Input-Multiple-Output) antennas), radio frequency (RF) transceiver circuitry 204. The mobile terminal 102 may further include baseband modem 206 (also referred to as baseband circuit 206), and application processor 208. It is to be noted that RF transceiver circuitry 204 and baseband modem 206 may together form modem 210.

It is appreciated that the aforementioned components of mobile terminal 102, for example, RF transceiver 204, baseband modem 206, and application processor 208 may be implemented in a number of different manners, such as by hardware, firmware, software executed on hardware (e.g. a processor), or any combination thereof. Various option include analog circuit(s), digital circuit(s), logic circuit(s), processor(s), microprocessor(s), controller(s), microcontroller(s), scalar processor(s), vector processor(s), Central Processing Unit(s) (CPU), Graphics Processing Unit(s) (GPU), Digital Signal Processor(s) (DSP), Field Programmable Gate Array(s) (FPGA), integrated circuit(s), or Application Specific Integrated Circuit(s) (ASIC).

As shown in FIG. 2, the aforementioned components of mobile terminal 102 may be implemented as separate components. However, it is appreciated that the architecture of mobile terminal 102 depicted in FIG. 2 is for purposes of explanation, and accordingly one or more of the aforementioned components of mobile terminal 102 may be integrated into a single equivalent component or divided into two separate components with collective equivalence. It is understood that mobile terminal 102 may have one or more additional components, such as additional hardware, software, or firmware elements. For example, mobile terminal 102 may further include various additional components including hardware, firmware, processors, microprocessors, memory, and other specialty or generic hardware/processors/circuits, etc., in order to support a variety of additional operations. Mobile terminal 102 may also include a variety of user input/output devices (display(s), keypad(s), touchscreen(s), speaker(s), external button(s), camera(s), microphone(s), etc.), peripheral device(s), memory, power supply, external device interface(s), subscriber identify module(s) (SIM) etc.

As will be detailed, in an aspect of the disclosure mobile terminal 102 may be a mobile terminal device having a radio processing circuit (RF transceiver 204) and a baseband processing circuit (baseband modem 206) adapted to interact with the radio processing circuit. Mobile terminal 102 may be configured to provide each of a plurality of samples of a frequency-domain signal sequence as input to each of a plurality of inverse frequency transform computations, execute the plurality of inverse frequency transform computations to obtain a plurality of intermediate transforms, wherein each of the plurality of intermediate transforms are composed of a respective plurality of samples, combine the respective plurality of samples of each of the plurality of intermediate transforms to obtain a time-domain representation of the frequency-domain signal sequence, and generate a random access preamble with the time-domain representation of the frequency-domain signal sequence. Additionally and/or alternatively, mobile terminal 102 may be configured to identify a preamble frequency position in the frequency domain, execute a plurality of inverse frequency transform computations on each of a plurality of samples of a frequency-domain signal sequence to obtain a plurality of intermediate transforms, wherein each of the plurality of intermediate transforms are composed of a plurality of samples, apply a respective frequency shift to each sample of the plurality of samples of each of the plurality of intermediate transforms to generate a respective plurality of frequency-shifted samples for each of the plurality of intermediate transforms, wherein each respective frequency shift is dependent on the preamble frequency position, and combine the respective plurality of frequency-shifted samples of each of the plurality of intermediate transforms to generate a time-domain representation of the frequency-domain signal sequence.

Figure 3:
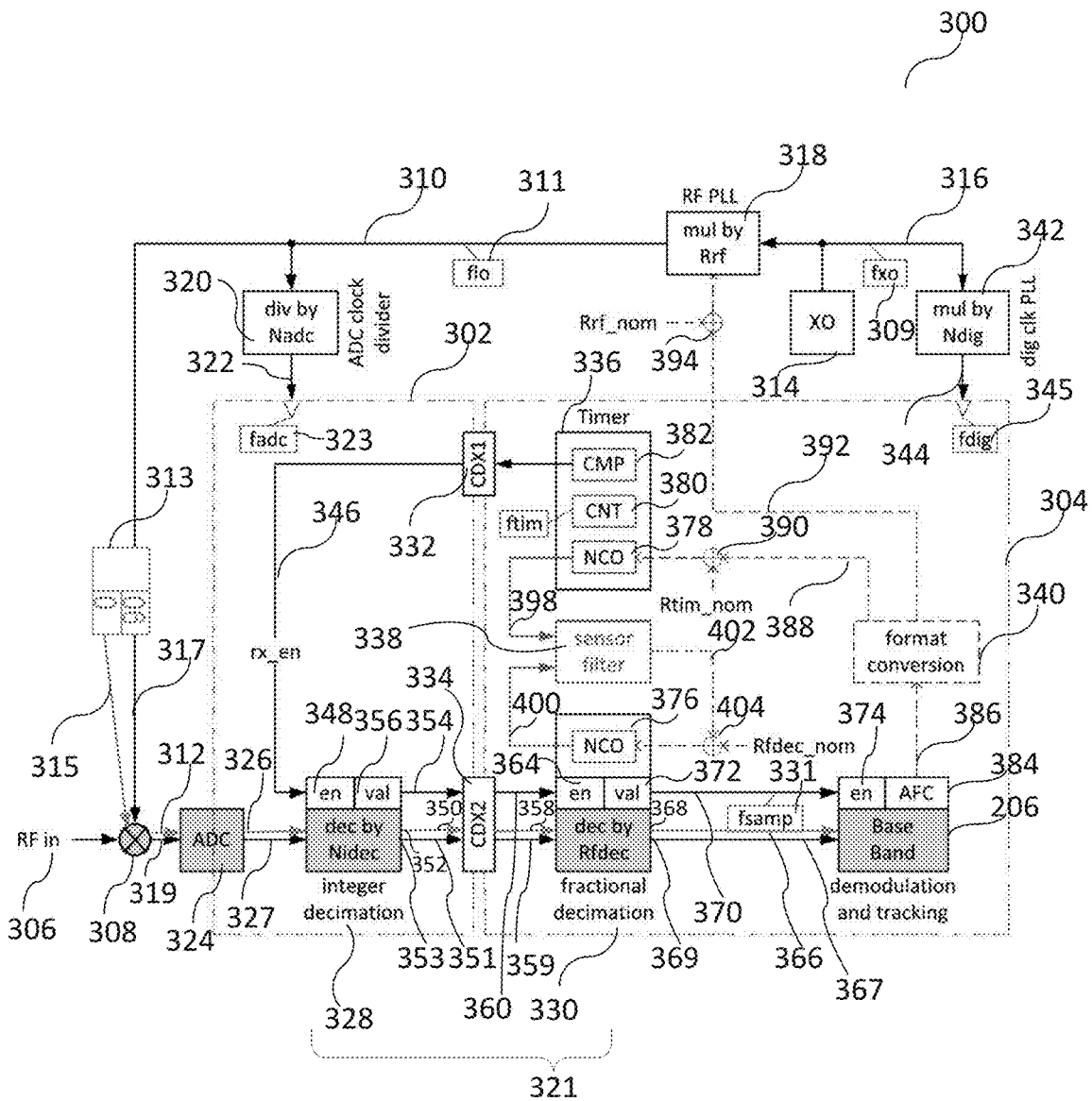
FIG. 3 shows a circuit arrangement in accordance with various aspects of this disclosure.

Further according to the abridged overview of operation of mobile terminal 102, RF transceiver circuitry 204 may receive radio frequency wireless signals via antenna 202, which may be implemented as e.g. a single antenna or an antenna array composed of multiple antennas. RF transceiver circuitry 204 may include various reception circuitry elements, which may include e.g. analog circuitry, configured to process externally received signals, such as mixing circuitry to convert externally received RF signals to baseband and/or intermediate frequencies. RF transceiver circuitry 204 may also include amplification circuitry to amplify externally received signals, such as power amplifiers (PAs) and/or Low Noise Amplifiers (LNAs), although it is appreciated that such components may also be implemented separately. RF transceiver circuitry 204 may additionally include various transmission circuitry elements configured to transmit internally received signals, such as e.g. baseband and/or intermediate frequency signals provided by baseband modem 206, which may include mixing circuitry to modulate internally received signals onto one or more radio frequency carrier waves and/or amplification circuitry to amplify internally received signals before transmission. RF transceiver circuitry 204 may provide such signals to antenna 202 for wireless transmission. Further references herein to reception and/or transmission of wireless signals by mobile terminal 102 may thus be understood as an interaction between antenna 202, RF transceiver circuitry 204, and baseband modem 206 as detailed above. Although not explicitly depicted in FIG. 2, RF transceiver circuitry 204 may additionally be connected to application processor 208. RF transceiver circuitry 204 may include a circuit arrangement as shown in FIG. 3 (except for the baseband circuit 206), which will be described in more detail below with reference to FIG. 3. However, it is to be noted that one or more components or all the components of the circuit arrangement as shown in FIG. 3 (except for the baseband modem 206) may form a separate circuit coupled between the RF transceiver 204 and the baseband modem 206.

In various aspects of this disclosure, base station 110 transmits radio signals 120a, 120b, to mobile terminals 102, 104. Radio signals may include 120a, 120b various information items including control data and use data. By way of example, base station 110 transmits radio signals 120a, 120b to mobile terminals 102, 104 in radio frames. Radio signals 120a, 120b may include signals such as e.g. PSS and/or SSS, e.g. cyclic prefix signals. Furthermore, radio signals 120a, 120b may include signals encoded in accordance with UMTS. By way of example, radio signals 120a, 120b may include Frequency Division Duplex (FDD) signals or Time Division Duplex (TDD) signals. Furthermore, radio signals 120a, 120b may include Wideband Code Division Multiple Access (W-CDMA) signals.

For illustrative purposes only, at the beginning, the architecture of a circuit arrangement will be described, many components of which are similar to a conventional circuit arrangement using a single point AFC (single point automatic frequency control, SPAFC), i.e. using a tuned reference frequency. This architecture is then evolved to support stable Multi-point AFC, i.e. using free-running reference frequency. As will be described in more detail below, one of the aspects provided in this disclosure is the sample to timer drift, which may be addressed by various aspects of this disclosure.

FIG. 3 shows a (clock synchronous) circuit arrangement 300 in accordance with various aspects of this disclosure.

FIG. 3 shows the circuit arrangement 300 including a receiver topology with focus on clock generation and sampling rate conversion. Assuming a conventional single point AFC would mean that the reference frequency of a reference signal (e.g. an oscillator signal 316 having an oscillator frequency $f_{xo}$), e.g. provided by an oscillator circuit 314, is tuned directly. Hence the ratio of all derived frequencies would be independent of the automatic frequency control (AFC).

Referring now to FIG. 3, the circuit arrangement 300 may generally include a plurality of different frequency or clock domains, such as e.g. a higher frequency clock domain 302 and a lower frequency clock domain 304. The clock signal frequency or clock signal frequencies in the higher frequency clock domain 302 are usually higher than the clock signal frequency or clock signal frequencies in the lower frequency clock domain 304. However, it is to be noted that in various aspects of this disclosure, the clock signal frequency or clock signal frequencies in the higher frequency clock domain 302 may be lower than the clock signal frequency or clock signal frequencies in the lower frequency clock domain 304, e.g. in a circuit arrangement provided for a GSM communications network.

By way of example, as shown in FIG. 3, the circuit arrangement 300 receives an analog radio frequency signal (e.g. the radio signal 120a, 120b), digitizes it and reduces the sampling rate of the signal down to a sampling rate desired or required for the baseband modem 206. In more detail, in this implementation, the circuit arrangement 300 receives an analog radio frequency signal (RF in) 306 and applies the same to a mixer circuit 308.

As also shown in FIG. 3, the circuit arrangement 300 may in various implementations include an oscillator circuit 314, which may include or may be implemented as a quartz oscillator circuit 314. The oscillator circuit 314 may generate an oscillator signal 316 having an oscillator frequency $f_{xo}$ 309. The oscillator signal 316 may serve as a basis for signals having frequencies derived from the oscillator frequency $f_{xo}$ 309 of the oscillator signal 316. Signals having frequencies derived from the oscillator frequency $f_{xo}$ 309 of the oscillator signal 316 may represent clock signals for the higher frequency clock domain 302 and for the lower frequency clock domain 304. The circuit arrangement 300 may further include an RF PLL (radio frequency phase locked loop) circuit 318 configured to multiply the oscillator frequency $f_{xo}$ 309 of the oscillator signal 316 with a rational PLL factor $R_{rf}$ ($R_{rf}$ being an rational number) to generate the local oscillator signal 310 having the local oscillator frequency $f_{lo}$ 311 (optionally, a target divider ratio $R_{rf\_nom}$ of the RF PLL circuit may be stored in a first register (not shown of the circuit arrangement 300); the target divider ratio $R_{rf\_nom}$ of the RF PLL circuit 318 may be written in the first register by firmware, for example. Thus, the rational PLL factor $R_{rf}$ may be configurable, e.g. based on the target divider ratio $R_{rf\_nom}$, e.g. under the control of firmware.

Thus, in an exemplary implementation, an input of the RF PLL circuit 318 is (e.g. directly) coupled to an output of the oscillator circuit 314 and may be configured to receive the (analog) oscillator signal 316 having the oscillator frequency $f_{xo}$ 309 and to generate the (analog) local oscillator signal 310 having the local oscillator frequency $f_{lo}$ 311 by multiplying the oscillator frequency $f_{xo}$ 309 of the (analog) oscillator signal 316 with the rational PLL factor $R_{rf}$.

The RF PLL circuit 318 may include an output at which it provides the local oscillator signal 310. Furthermore, the circuit arrangement 300 may include a circuit 313 configured to split the local oscillator signal 310 in two phase-shifted local oscillator signals 315, 317, which have the same frequency, namely the local oscillator frequency $f_{lo}$ 311. However, the two phase-shifted local oscillator signals 315, 317 are phase shifted with respect to each other by π/2. The circuit 313 may apply the two phase-shifted local oscillator signals 315, 317 to the mixer circuit 308. The mixer circuit 308 may be configured to mix the analog radio frequency signal (RF in) 306 with the two phase-shifted local oscillator signals 315, 317, respectively, to generate a downconverted (analog complex valued) I signal 312 and a downconverted (analog complex valued) Q signal 319.

The mixer circuit 308 may be a multiplier circuit configured to multiply the radio frequency signal (RF in) 306 with the two phase-shifted local oscillator signals 315, 317 having the local oscillator frequency $f_{lo}$ 311, respectively, to generate the downconverted analog IQ signals 312, 319 and to apply the same to an analog-to-digital-converter (ADC) circuit 324 and via that to a decimation circuit 321. The carrier frequency of the analog radio frequency signal (RF in) 306 may be in the range of several GHz, e.g. in the range from about 0.5 GHz to about 5 GHz. The frequency of the downconverted analog IQ signals 312, 319 may be in the range of several hundred MHz.

Furthermore, circuit arrangement 300 may include an analog-to-digital converter clock divider circuit 320 configured to divide the local oscillator frequency $f_{lo}$ 311 of the local oscillator signal 310, which the analog-to-digital converter clock divider circuit 320 may receive at one of its input(s), by an integer divisor $N_{adc}$, to generate an analog-to-digital converter clock signal 322 having an analog-to-digital converter clock frequency $f_{adc}$ 323. The analog-to-digital converter clock divider circuit 320 may supply the analog-to-digital converter clock signal 322 to the higher frequency clock domain 302 as its basic clock signal.

Furthermore, the circuit arrangement 300 may include the analog-to-digital converter circuit 324 arranged in the higher frequency clock domain 302. The analog-to-digital converter circuit 324 receives the analog-to-digital converter clock signal 322 at its sampling input (not shown) and receives the downconverted IQ signals 312, 319 at its analog inputs as the signals to be digitized. The analog-to-digital converter circuit 324 is configured to sample the downconverted analog IQ signals 312, 319 in accordance with the analog-to-digital converter clock signal 322 to thereby digitize the downconverted analog IQ signals 312, thereby generating digital IQ signals 326, 327 (e.g. including a (complex valued) digital I signal 326 and a digital (complex valued) Q signal 327).

Moreover, the decimation circuit 321 may include an optional integer decimation circuit 328 and a downstream coupled fractional decimation circuit 330. The integer decimation circuit 328 may be arranged in the higher frequency clock domain 302 and the fractional decimation circuit 330 may be arranged in the lower frequency clock domain 304. The fractional decimation circuit 330 may be provided because the local oscillator frequency $f_{lo}$ 311 of the local oscillator signal 310 is variable while the baseband modem 206 expects the signals to be processed (e.g. the digital I Q signals) at a fixed predefined sampling rate $f_{samp}$ 331.

The circuit arrangement 300 may further include a further PLL circuit 342 configured to multiply the oscillator frequency $f_{xo}$ 309 of the oscillator signal 316, which the further PLL circuit 342 may receive at one of its input(s), with an integer factor $N_{dig}$, to generate a digital clock signal 344 having a digital clock frequency $f_{dig}$ 345. The further PLL circuit 342 may supply the digital clock signal 344 to the lower frequency clock domain 304 as its basic clock signal.

It is to be noted that clock domain crossing circuits, e.g. a first clock domain crossing circuit CDX1 332 and a second clock domain crossing circuit CDX2 334, may be provided to couple a circuit arranged in the lower frequency clock domain 304 with a circuit arranged in the higher frequency clock domain 302, and vice versa. By way of example, the first clock domain crossing circuit 332 may be provided to transfer signals from the lower frequency clock domain 304 to the higher frequency clock domain 302, and the second clock domain crossing circuit 334 may be provided to transfer signals from the higher frequency clock domain 302 to the lower frequency clock domain 304. The clock domain crossing circuits 332, 334 may be formed of flip flop circuits configured to ensure frequency and phase synchronism of the respective signals in the different clock domains 302, 304.

As will be described in more detail below, the following circuits may be arranged in the lower frequency clock domain 304:
the fractional decimation circuit 330;
a timer circuit 336;
a feedback control circuit 338; and
optionally a format conversion circuit 340.

In the following, the data flow processing of the received radio signals (e.g. 120a, 120b) will be described in more detail.

As previously described, the analog-to-digital converter 324 may supply the digital IQ signals 326, 327 to the decimation circuit 321 and therein e.g. to the integer decimation circuit 328. The integer decimation circuit 328 reduces the sampling rate of the digital IQ signals 326, 327 from a few hundred MHz to several MHz (e.g. by an integer factor $N_{idec}$).

An integer decimation enable signal (rx_en) 346 may enable the integer decimation circuit 328 via an enable input 348 of the integer decimation circuit 328. Illustratively, the timer circuit 336 may be configured to switch the integer decimation enable signal (rx_en) 346 on or off in the timer grid with the time period $T_{tim}=1/f_{tim}$. By choosing $f_{tim}=f_{samp}$, the timer circuit 336 may ensure coherence of the sampling grid after the above described monitoring.

The generation of the integer decimation enable signal 346 will be described in more detail below. As soon as the integer decimation circuit 328 has completed the integer decimation of the digital IQ signals 326, 327, the integer decimation circuit 328 provides the result of the integer decimation as integer decimated IQ signals 350, 351 at its first signal outputs 352, 353. In order to indicate the validity of a respective IQ signal sample of the integer decimated IQ signals 350, 351 at its first signal outputs 352, 353, the integer decimation circuit 328 has a second signal output 356 providing a valid signal 354. Thus, the valid signal 354 indicates if the integer decimated IQ signals 350, 351 provided at the first signal outputs 352, 353 are valid or not. The integer decimation circuit 328 may supply the integer decimated IQ signals 350, 351 and the valid signal 354 to the second clock domain crossing circuit 334, which synchronizes the integer decimated IQ signals 350, 351 coming from the higher frequency clock domain 302 with the lower frequency clock domain 304.

The second clock domain crossing circuit 334 thus supplies synchronized integer decimated IQ signals 358, 359 and a synchronized valid signal 360 to the fractional decimation circuit 330 arranged in the lower frequency clock domain 304. The synchronized valid signal 360 serves as enabling signal for the fractional decimation circuit 330 at its enble input 364. The fractional decimation circuit 330 further reduces the sampling rate of the synchronized integer decimated IQ signals 358, 359 further down to a predefined fixed sampling rate of e.g. about 7.68 MHz (e.g. by a rational factor $R_{fdec}$; the rational factor may be represented as $R_{fdec}=K_x/L_x$, $K_x$ and $L_x$ being integer numbers, respectively). It should be noted that any other non-integer value (or if desired also integer value) may be possible for the predefined fixed sampling rate.

Thus, as soon as the fractional decimation circuit 330 has completed the fractional decimation of the synchronized integer decimated IQ signals 358, 359, the fractional decimation circuit 330 provides the result of the fractional decimation as fractional decimated IQ signals 366, 367 at its first signal outputs 368, 369. Furthermore, the fractional decimation circuit 330 has a second signal output 372 to provide a valid signal 370 to indicate if the signal samples of the fractional decimated IQ signals 366, 367 currently provided at the first signal outputs 368, 369, are valid or not. The fractional decimation circuit 330 may supply the fractional decimated IQ signals 366, 367 and the valid signal 370 to the baseband modem 206. The valid signal 370 provided by the fractional decimation circuit 330 may serve as enabling signal for the baseband modem 206 at its enble input 374. It is to be noted that the baseband modem 206 may be configured to process the received signals, e.g. the fractional decimated IQ signals 366, 367, at the predefined fixed sampling rate.

The baseband modem 206 may be configured to appropriately process (e.g. demodulate, channel decode, etc.) the received signals (i.e. for example the fractional decimated IQ signals 366, 367 (which include complex valued I and Q signal components) only in case the enabling signal 370 has the predefined fixed sampling rate. Illustratively, the baseband modem 206 "expects" to receive the signals to be processed in accordance with the fixed sampling rate. Thus, the sampling rate $f_{samp}$ of the valid signal 370 provided by the fractional decimation circuit 330 should be equal to the predefined fixed sampling rate as accurately as possible.

As mentioned above, the circuit arrangement 300 is based on a free-running oscillator. In various aspects of this disclosure, the fractional decimation circuit 330 and the timer circuit 336 may include separate individual oscillator circuits, e.g. numerically controlled oscillators, which will be described in more detail below. The numerically controlled oscillator of the timer circuit 336 may be implemented in software.

In the example shown in FIG. 3, the fractional decimation circuit 330 may include a fractional decimation numerically controlled oscillator (NCO) 376, which may use the synchronized valid signal 360 and thus the enabling signal of the fractional decimation circuit 330 as its reference clock providing a fractional decimation NCO clock signal clocking the data path of the fractional decimation circuit 330.

The frequency of the fractional decimation NCO clock signal may be corrected using a target fractional decimation NCO division value $R_{fdec\_nom}$ which may be stored in a second register (not shown). The target fractional decimation NCO division value $R_{fdec\_nom}$ may be written in the second register by firmware, for example.

Furthermore, in one implementation, as shown in FIG. 3, the timer circuit 336 may include a timer numerically controlled oscillator (NCO) 378 (which may use the digital clock frequency $f_{dig}$ of the lower frequency clock domain 304 as its driver) providing a timer NCO clock signal clocking the timer circuit 330, in more detail, a counter 380 of the timer circuit 336. Thus, illustratively, the timer NCO 378 is clock driven (e.g. driven by the digital clock frequency $f_{dig}$), and the fractional decimation NCO 376 is data driven (e.g. driven by the synchronized valid signal 360).

The frequency of the timer NCO clock signal may be determined using a target timer NCO division value $R_{tim\_nom}$ (which illustratively sets the frequency of the signal generated by the timer NCO 378), which may be stored in a third register (not shown). The target timer NCO division value $R_{tim\_nom}$ may be written in the second register by firmware, for example. The timer circuit 336 may include the timer NCO 378, the counter circuit 380, and a comparator 382. The timer NCO 378 generates a signal having the timer frequency $f_{tim}$ (which is based on the target timer NCO division value $R_{tim\_nom}$) and supplies the signal to the counter circuit 380 to increment the counter value. The counter circuit 380 generates a comparator trigger signal dependent on a predefined and stored target counter value and supplies the comparator trigger signal to the comparator 382. When the comparator trigger signal is e.g. logic "high" ("1"), the comparator 382 generates a logic "high" (logic "1") voltage signal, which forms the integer decimation enable signal 346. The integer decimation enable signal 346 may be understood as a quasi static signal to enable the integer decimation circuit 328. As long as the integer decimation enable signal 346 is logic "high" (logic "1"), the integer decimation circuit 328 receives the input digital IQ signals 326, 327. In other words, the integer decimation enable signal 346 is logic "high" (logic "1") as long as the integer decimation circuit 328 should receive the digital IQ signals 326, 327 (this may last e.g. many hours). The digital IQ signals 326, 327, in other words the samples of the digital IQ signals 326, 327 are supplied to the input of the integer decimation circuit 328 with $f_{ADC}$. Thus, illustratively, a new sample will be generated every HW cycle. Illustratively, the integer decimation enable signal 346 serves to start the integer decimation circuit 328 accurately in time and then to keep the integer decimation circuit 328 enabled (in other words running).

The comparator 382 thus generates the integer decimation enable signal 346 and supplies the same to the first clock domain crossing circuit 332, and via that, to the enable input 348 of the integer decimation circuit 328, as described above.

Since in various aspects of this disclosure, a free running oscillator is provided (this may result in a so-called MPAFC (multi-point automatic frequency control) circuit), the following signals having critical derived frequencies may be corrected individually:
the local oscillator signal 310 having the local oscillator frequency $f_{lo}$ 311 (which is directly derived from the oscillator signal 316 having the oscillator frequency $f_{xo}$ 309 using the RF PLL circuit 318);
the valid signal 370 provided by the fractional decimation circuit 330 having the sampling rate $f_{samp}$ 331; and
the signal provided by the timer NCO 378 and having the timer frequency $f_{tim}$.

In order to provide the MPAFC, the circuit arrangement 300 may further include an AFC circuit 384 and the format conversion circuit 340. The format conversion circuit 340 may be configured to set the local oscillator frequency $f_{lo}$ 311 such that the frequency error of the fractional decimated IQ signals 366, 367, which the baseband modem 206 receives, is approximately zero ("0"). In various aspects, the baseband modem 206, e.g. the AFC circuit 384, estimates the frequency error of the fractional decimated IQ signals 366, 367, and generates suitable correction values to the format conversion circuit 340, which may forward e.g. a thus generated target RF PLL circuit division value correction signal 392. The baseband modem 206 may further be configured to correct a possible phase error of the fractional decimated IQ signals 366, 367.

The AFC circuit 384 may be configured to determine any frequency error of the fractional decimated IQ signals 366, 367 provided by the fractional decimation circuit 330 (e.g. a relative frequency error of the fractional decimated IQ signals 366, 367 relative to the channel center frequency of the analog radio frequency signal (RF in) 306), which the baseband modem 206 receives and to generate one or more corresponding correction signals 386 and to supply the same to the format conversion circuit 340. The format conversion circuit 340 receives the correction signals 386 and may be configured to forward correction values e.g. for the target timer NCO division value $R_{tim\_nom}$ and/or the RF PLL circuit division value $R_{rf\_nom}$ and/or the target fractional decimation NCO division value $R_{fdec\_nom}$.

It is to be noted that in the case of an SP AFC as well as in the case of an MP AFC in accordance with various aspects of this disclosure, the AFC circuit 384 may be configured to provide the shift correction signals 386 such that they include a signal representing a value that is proportional to the relative frequency error of the channel center frequency. By way of example, assuming that the channel center frequency of the analog radio frequency signal (RF in) 306 $f_{chan}$=1 GHz, that the frequency error of the fractional decimated IQ signals 366, 367 that the baseband modem 206 determines is $f_{err}$=1 kHz, the relative frequency error would result in $$eps = \frac{1 \text{ kHz}}{1 \text{ GHz}} = 1 \text{ ppm}.$$

In an exemplary implementation, in the MP AFC,
the target timer NCO division value $R_{tim\_nom}$ may be corrected by a value $-eps*R_{tim\_nom}$, and/or
the RF PLL circuit division value $R_{rf\_nom}$ may be corrected by a value $-eps*R_{rf\_nom}$.

The target fractional decimation NCO division value $R_{fdec\_nom}$ may be subject to correction by the feedback control circuit. It is to be noted that the error to be corrected in the target fractional decimation NCO division value $R_{fdec\_nom}$ is significantly smaller than the relative frequency error described above. By way of example, the error to be corrected in the target fractional decimation NCO division value $R_{fdec\_nom}$ may be in the range of about 1 ppb (parts per billion).

By way of example, the format conversion circuit 340 may generate a target timer NCO division value correction signal 388 and may supply the same to a third adder circuit 390, and may thus add the same to the target timer NCO division value $R_{tim\_nom}$. The format conversion circuit 340 may store the resulting value in the third register and/or may supply the resulting value to the timer NCO 378 to adjust the frequency of the signal provided by the timer NCO 378. Furthermore, the format conversion circuit 340 may be configured to generate a target RF PLL circuit division value correction signal 392 and to supply the same to a first adder circuit 394, and to add the same to the target RF PLL circuit division value $R_{rf\_nom}$. The format conversion circuit 340 may store the resulting value in the first register and/or may supply the resulting value to the RF PLL circuit 318 to adjust the frequency of the signal provided by the RF PLL circuit 318. The correction of the signal provided by the RF PLL circuit 318 may result in that the analog-to-digital converter clock frequency $f_{adc}$ 323 of the analog-to-digital converter clock signal 322 and thus the sampling rate $f_{samp}$ 331 almost reach their nominal values (but not exactly, in contrast to the timer frequency $f_{tim}$).

The circuit arrangement 300 may further include the feedback control circuit 338 configured to control a phase difference between a timer NCO signal 398 (which is one example of the second signal) and a fractional decimation NCO signal 400 (which is one example of the first signal) to a predefined value, e.g. to a value "0" (zero). The feedback control circuit 338 may be implemented as an "I" feedback control circuit or as a "PI" feedback control circuit, for example. The feedback control circuit 338 may generate a fractional decimation division value correction signal 402 and may supply the same to a second adder circuit 404, and may add the same to the target fractional decimation NCO division value $R_{fdec\_nom}$. The feedback control circuit 338 feedback control circuit 338 may store the resulting value in the second register and/or may supply the resulting value to the fractional decimation NCO 376 to adjust the frequency and/or the phase (in various aspects of this disclosure mainly the phase) of the signal provided by the fractional decimation NCO 376.

It is to be noted that in various aspects of this disclosure, it may be sufficient to only determine a phase difference or a frequency difference between a timer NCO signal 398 (which is one example of the second signal) and a fractional decimation NCO signal 400 (which is one example of the first signal), and not also control the difference to a specific value. In this case, only a difference determination circuit may be provided (which may be part of the feedback control circuit 338) configured to determined the phase difference or the frequency difference between e.g. the timer NCO signal 398 (which is one example of the second signal) and e.g. the fractional decimation NCO signal 400 (which is one example of the first signal).

Illustratively, the feedback control circuit 338 may be configured to ensure that the timer NCO signal 398 and the fractional decimation NCO signal 400 remain "in-phase" and thus to ensure that, although a free-running oscillator circuit is used, the signal provided to the baseband modem 206 is always (for every time instant) in a correct phase so that the baseband modem 206 can process the received signal properly. Illustratively, an additional "inner" control loop is provided to feedback control the phase and/or the frequency of the signals of the fractional decimation NCO 376.

It is to be noted that is also possible to provide a feedback control of the phase and/or the frequency of the signals of the timer NCO 378.

This circuit arrangement 300 provides MPAFC which substantially behaves like SPAFC, however, special attention is paid to keep the ratios between the derived frequencies (e.g. the three above frequencies) exactly constant at every instant in time, i.e. in stationary operation and during parameter update. It has been found out that critical may be the ratio $f_{samp}/f_{tim}$. Since the frequency $f_{samp}$ in this example is proportional to $f_{lo}$, also the ratio $f_{samp}/f_{lo}$ may be considered.

In other words, various aspects of this disclosure may hold the phase between the timer tick and the sampling instant constant. Thus, in various aspects of this disclosure, the system may not only be frequency locked, but also phase locked, although the phase initially may have an arbitrary displacement to each other, but the displacement should be kept constant over quite a long time, e.g. over several hours.

In order to address a systematic timer to sampling frequency offset, an adjustment of the following frequencies (or more exactly of the respective signals having the respective frequencies) may be provided as follows:

$f_{lo}$ via a fractional PLL with about 30 bit resolution. This corresponds to a relative quantization error of $2^{-30} \cong 10^{-9}$ or 1 Hz/1 GHz;

$f_{tim}$ via an NCO with 35 bit resolution corresponding to a relative quantization error of $2^{-35} \cong 3*10^{-11}$; and $f_{samp}$ via $R_{fdec}$: Since $f_{lo}$ is 30 bit accurate, $f_{samp}$ is 30 bit accurate as well for the nominal $R_{fdec\_nom}$. Since, by way of example, a 43 bit accuracy may be desired for $$\frac{f_{samp}}{f_{tim}} = 1 + \varepsilon,$$

$R_{fdec}$ may be fine-tuned with at least 43 bit accuracy.

In order to address non-deterministic errors due to e.g. AFC control and thus, in order to make the MPAFC updates become effective simultaneously, individual lead times may be considered according to the relevant settling times or group delays. Determining accurate lead times for the fractional PLL circuit and the fractional decimation circuit may be a complex task because lead times are affected by a variety of parameters and analogue tolerances. Lead time errors may cause a shift between timer and sample grid and these shifts may accumulate for the AFC updates.

In summary, it is to be noted that:

It is a challenge to guarantee accumulated error below $T_{chip}/40$ after 20 hours ($\varepsilon < 2^{-43}$).

Debugging will be extremely time-consuming.

Implementing the fractional decimation factor with 43 bit resolution is feasible.

Error accumulation due to AFC updates is highly risky, if manageable at all.

The required accuracy cannot be guaranteed with sufficient confidence.

In order to address these issues, in various aspects of this disclosure, illustratively, an automatic sampling control via a feedback loop (NCO-PLL) may be provided. Both timer circuit 336 and fractional decimation circuit 330 may incorporate a Numerically Controlled Oscillator (NCO). The state variable of the timer NCO 378 may represent the timer's phase and the state variable of the fractional decimation NCO 376 may represent the output sampling phase of the fractional decimation circuit 330.

It is to be noted, that in various aspects of this disclosure, the feedback loop (NCO-PLL) may already control the phase of a sampling time and may lock to the phase of the timer ticks. This control may be implemented by a slight correction of the target fractional decimation NCO division value $R_{fdec\_nom}$, thereby slightly changing the sampling frequency of the fractional decimation circuit 330, but only to the extent that the desired phase is achieved. As mentioned above, the controller may be configured as an "I" controller, i.e. as a controller having an integral part.

It is to be mentioned that it is also possible to control the phase (as an alternative or in addition to the frequency) of the "slave NCO".

In various aspects of this disclosure, the feedback control circuit 338 may include a sensor (not shown) and a filter (not shown). The sensor may measure the delta phase and let the filter determine the drift of the delta phase measurements. The filter then may tune the fractional decimation NCO 376 to remove the drift.

Figure 4:
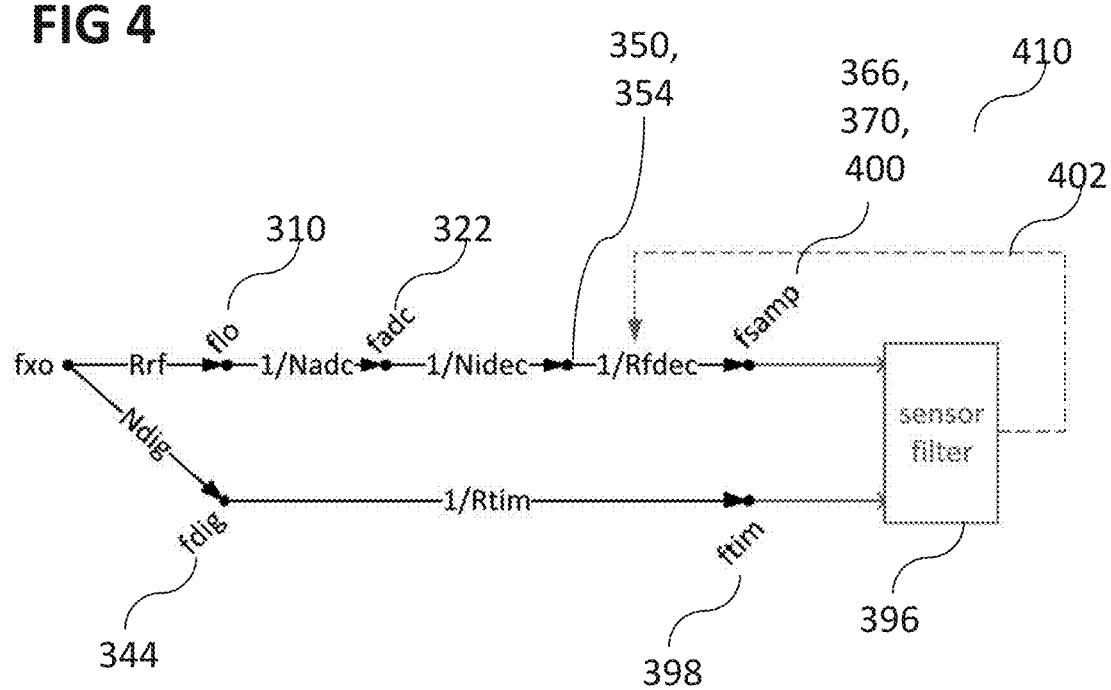
FIG. 4 shows a frequency graph illustrating signal frequencies occurring in the circuit arrangement of FIG. 3.

This high level view on the NCO-PLL (including the timer NCO 378 and the fractional decimation NCO 376) is reflected in FIG. 3 and FIG. 4.

As described above, timing in the mobile cellular receiver, which is e.g. part of the RF transceiver circuitry 204, may need to be synchronized to the base station 110 as a timing master. During reception of the radio signals (e.g. 120a, 120b) timing may be maintained via correlation techniques and a time tracking loop. During reception gaps (monitoring, DRX (Discontinuous Reception) or other (e.g. RRC) IDLE periods) timing may be maintained via a timer which is supposed to be synchronized to the sampling.

Two Problems May Occur Here:

I. There may be a systematic frequency offset between timer and sampling due to no fitting rational divider ratios.

II. Non-deterministic errors due to AFC updates may occur.

In general, in various aspects of this disclosure, a high frequency analog radio signal (e.g. 120a, 120b) in the range of e.g. GHz should be downconverted to a digital signal of a predefined fixed sampling rate in the range of e.g. a few MHz with high accuracy.

Debugging the above mentioned drift problems may often be difficult and time consuming. Therefore, it is desired to avoid such drifts completely or at least as much as possible.

Systematic Timer to Sampling Frequency Offset:

Assuming there is a systematic relative error specified as $$\frac{f_{tim}}{f_{samp}} = 1 + \varepsilon,$$

for $|\varepsilon| > 0$, the timer grid drifts against the sample grid. The drift may affect activities derived from the timer such as RFIC (radio frequency integrated circuit) control commands. One critical task may be resuming 3G reception after a so-called RRC (Radio Resource Control) compressed mode gap. Starting reception after the gap is usually based on the timer. In consequence, the drift error accumulated since the previous start of reception may be realized. In this particular use case the limit for the accumulated drift is Tchip/40. Long term stability may demand that the mobile terminal 102 (e.g. a user equipment, UE) was receiving continuously for 20 h prior to the compressed mode gap. This corresponds to $$\varepsilon = \frac{\frac{T_{chip}}{40}}{20h} = \frac{\frac{1}{(3.84e6 * 40)}}{20 * 3600} \cong 10^{-13} \cong 2^{-43},$$

i.e. 43 bit accuracy may be required to fulfil the above requirement.

Non-Deterministic Errors Due to AFC

When sampling frequency and timer frequency are updated by AFC, this should occur simultaneously. Otherwise, sampling phase and timer phase drift slightly according to the product of skew time and frequency change. These shifts may accumulate and may reach critical values for the above limits (Tchip/40 in 20 h).

The above described problems may be avoided by ensuring that the frequency $f_{tim}$ of the clock signal clocking the counter of the timer circuit is equal to the frequency $f_{samp}$ of the valid signal 370 provided by the fractional decimation circuit 330 (in other words by ensuring that $f_{tim} = f_{samp}$). This means that the timer circuit 336 and the sampling are always synchronous (synchronous also in phase; in various aspects of this disclosure, it may be ensured to keep the phase difference of these two mentioned signals constant, e.g. zero "0").

The circuit arrangement 300 as shown in FIG. 3 may be mapped to a frequency graph 410 as shown in FIG. 4 when considering the signal frequencies which may occur e.g. in the circuit arrangement 300 of FIG. 3. Mapping the frequency relationships of the respective signals and circuits of the circuit arrangement 300 of FIG. 3 to the frequency graph 400 results in the following frequency relationship:

$$f_{xo} * \frac{R_{rf}}{N_{adc} * N_{idec} * R_{fdec}} = f_{xo} * \frac{N_{dig}}{R_{tim}}, \quad (1)$$

wherein $R_{rf}$ represents a divider ratio of the RF PLL circuit 318;

$N_{adc}$ represents a divider ratio of the analog-to-digital converter clock divider circuit 320;

$N_{idec}$ represents a divider ratio of the integer decimation circuit 328;

$N_{dig}$ represents a divider ratio of the digital clock PLL circuit 342;

$R_{tim}$ represents a divider ratio of a numerically controlled oscillator circuit of the timer circuit which will be described in more detail below.

Solving equation (1) above for $$R_{fdec} = \frac{K_{fdec}}{L_{fdec}}$$

results in a resolution for $K_{fdec}$ and $L_{fdec}$ of 40 bit in the case of SP AFC. In the case of MP AFC, even more bits may be provided.

It is to be noted that since the timer and sampling frequencies are changed synchronously via the reference, as described above, measures to avoid non-deterministic errors (e.g. due to AFC update) may not be required.

Figure 5:
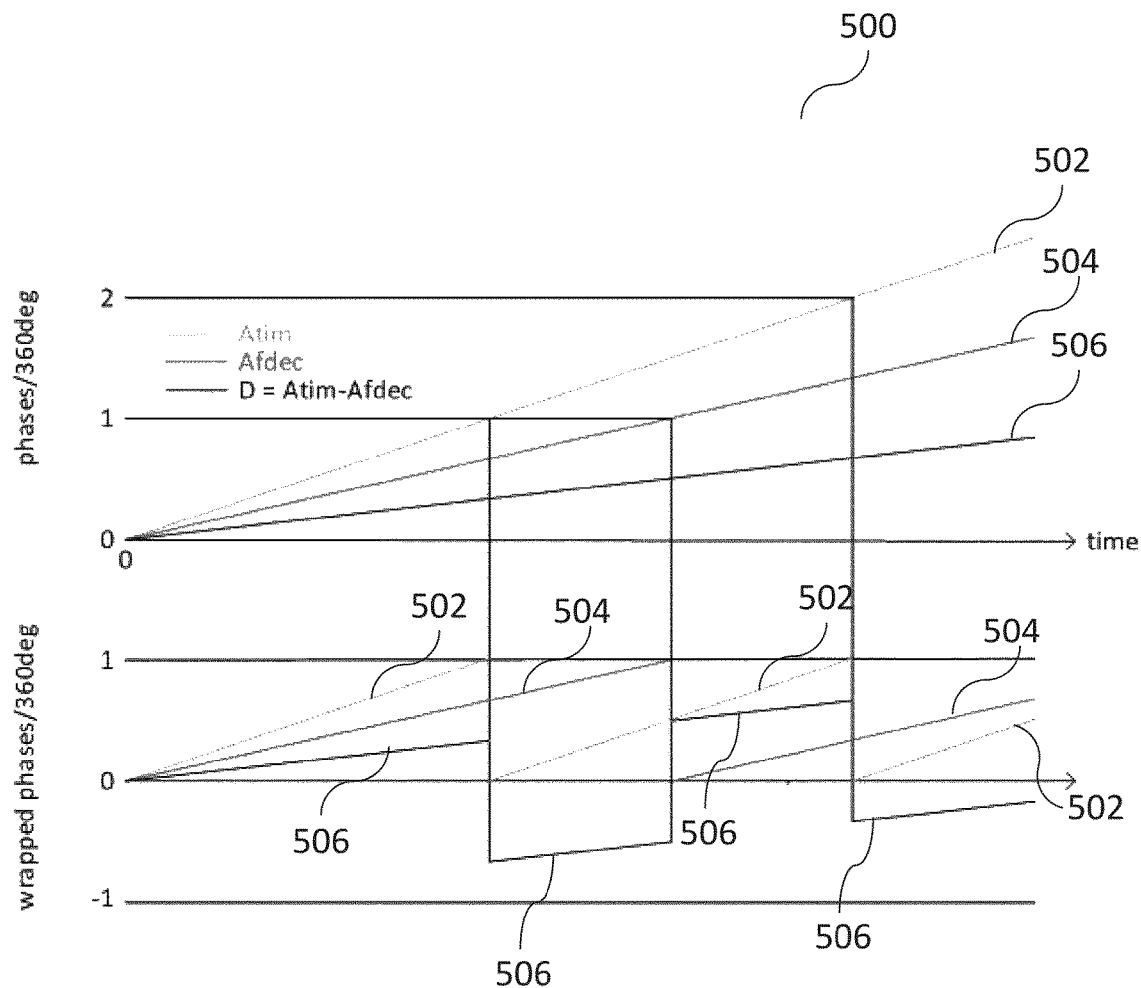
FIG. 5 shows a time diagram illustrating the phase drift of the timer NCO clock signal and the fractional decimation NCO clock signal of the circuit arrangement of FIG. 3.

FIG. 5 shows a time diagram 500 illustrating the open loop (i.e. assumed without the feedback control circuit 338) phase drift of the timer NCO clock signal 398 and the fractional decimation NCO clock signal 400 of the circuit arrangement 300 of FIG. 3.

A first (upper) portion of the time diagram 500 shows a phase drift characteristic 502 of the timer NCO clock signal 398, a phase drift characteristic 504 of the fractional decimation NCO clock signal 400 and a difference characteristic 506 showing the phase difference between the phase drift characteristic 502 of the timer NCO clock signal 398 and the phase drift characteristic 504 of the fractional decimation NCO clock signal 400.

In other words, FIG. 5 illustrates the drifting delta phase D between the timer phase $A_{tim}$ and the fractional decimation phase $A_{fdec}$ for the open loop case when $R_{fdec}$ is not corrected.

An NCO can maintain merely the wrapped phase signal as shown at a second (lower) portion of the time diagram 500. This wrapping causes approximately 360 degree steps if the phase curves are sampled densely enough.

Correspondingly, one will encounter the corresponding 360 degree steps in D, the signal of interest. Steps in D can be detected and removed if D is sampled densely enough.

Since the drift of D is very small, sampling of D (and hence $A_{tim}$ and $A_{fdec}$) at a very low rate is sufficient. Once D can be measured, it is a standard control theory problem to filter the D measurements and to close the loop with the goal to keep D constant at its initial value.

Thus, the control loop in accordance with various aspects of this disclosure may address both a systematic frequency offset as well as non-deterministic effects.

It is to be noted that the timer NCO 378 may be implemented in software.

Figure 6:
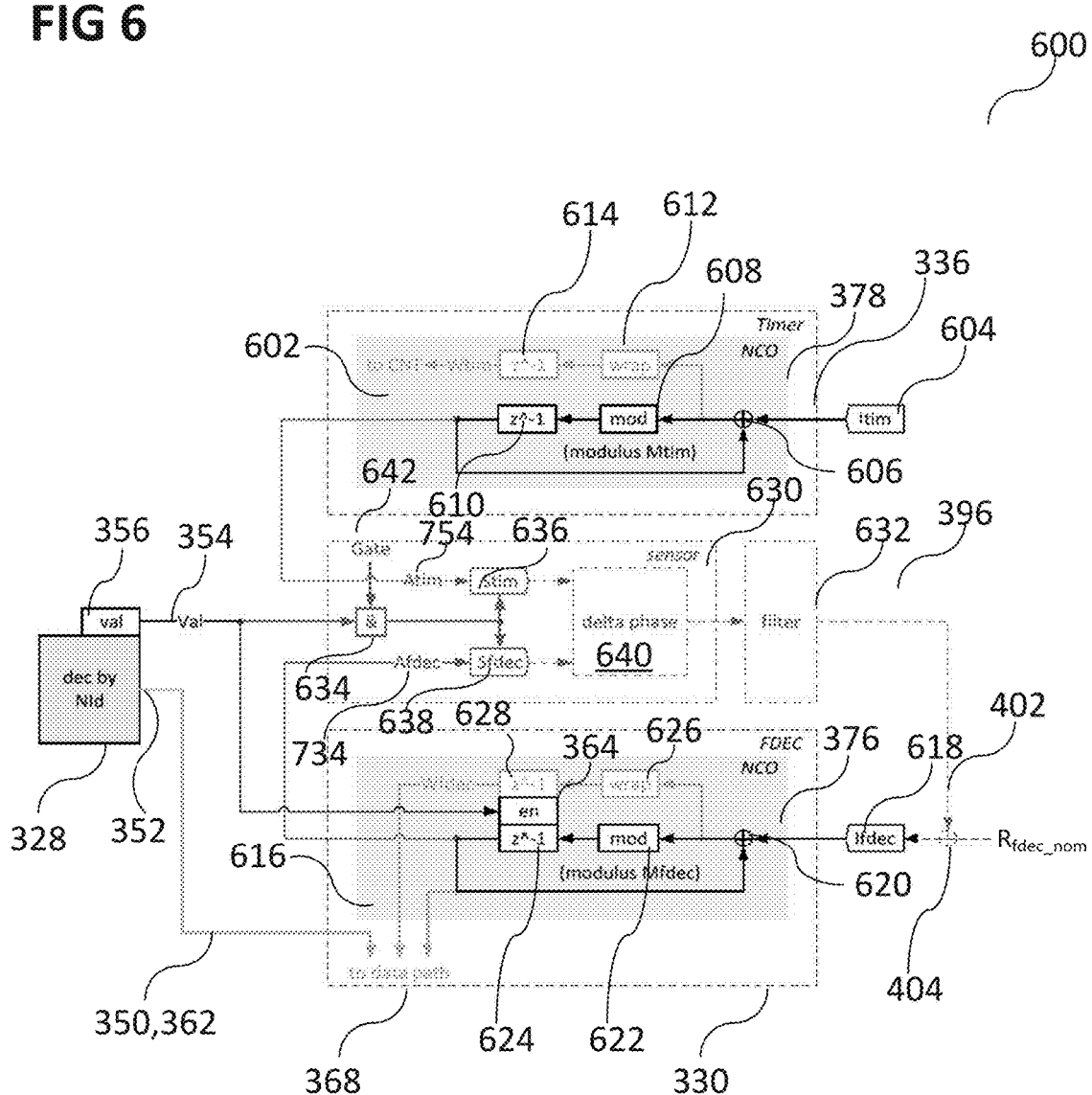
FIG. 6 shows an exemplary implementation of the feedback control circuit of FIG. 3.
Figure 7:
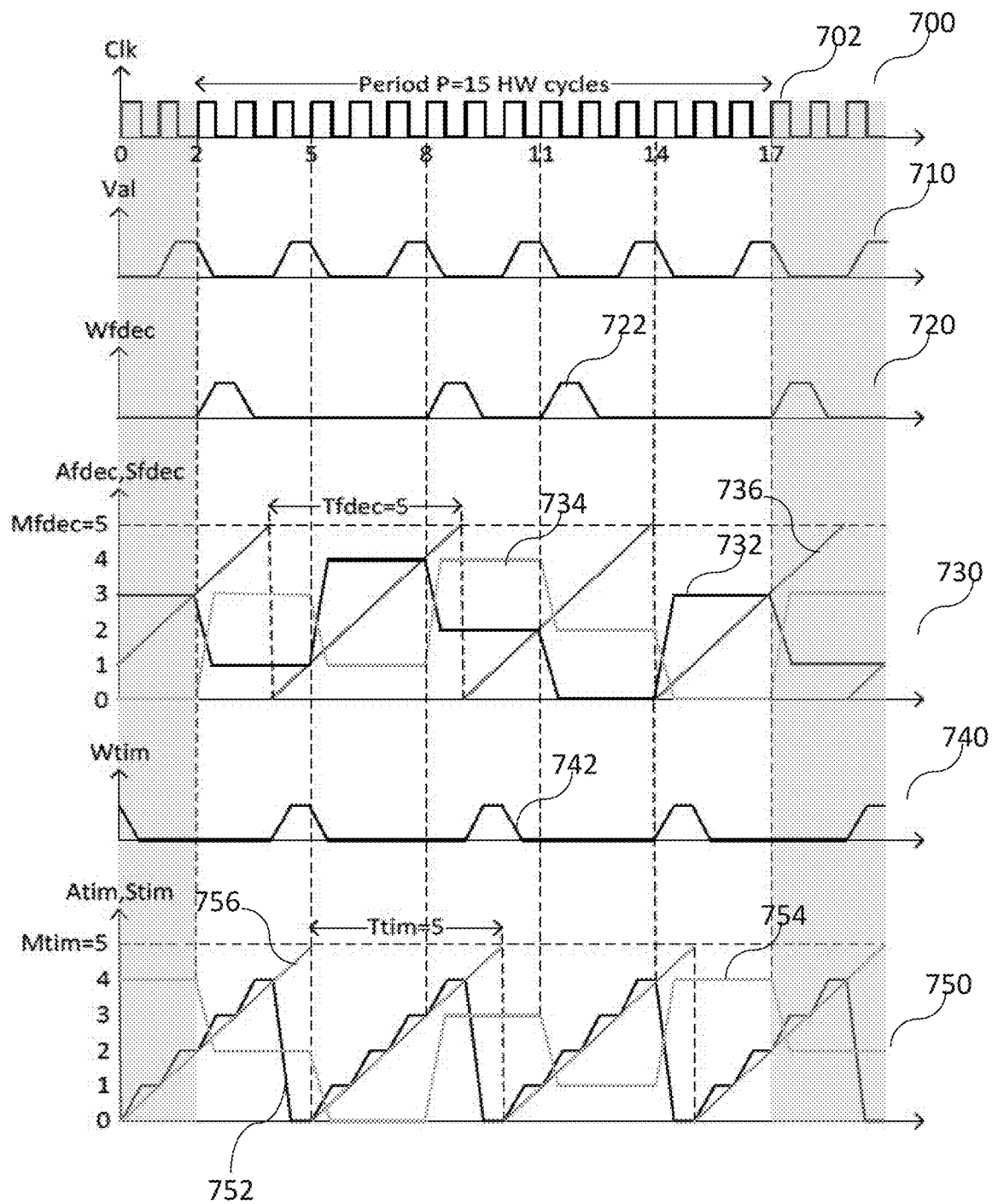
FIG. 7 shows a plurality of timing diagrams corresponding to the exemplary implementation of the feedback control circuit of FIG. 6.

FIG. 6 shows an exemplary implementation 600 of the feedback control circuit 338 and of the NCOs 376, 378, of FIG. 3. FIG. 7 shows corresponding timing diagrams. By way of example, a first timing diagram 700 shows a clock signal 702, e.g. a digital clock signal having a period P of 15 hardware cycles).

FIG. 6 illustrates a Finite State Machine model circuit of the NCOs 376, 378, of FIG. 3.

As shown in FIG. 6, the timer NCO 378 may be implemented as a back-coupled timer circuit 602. As described above, the value resulting from the sum of the target RF PLL circuit division value correction signal 392 and the target RF PLL circuit division value $R_{rf\_nom}$ (the sum may be referred to as amended target RF PLL circuit division value $I_{tim}$) may be stored in the first register or, alternatively, another register, which may be referred to as timer NCO register 604. Illustratively, the amended target RF PLL circuit division value $I_{tim}$ may be understood as an integer value which defines an increment value by which the timer NCO accumulator is incremented with every hardware (HW) clock cycle of the respective clock signal. An example of a hardware (HW) clock signal is shown in a first timing diagram 700 in FIG. 7. The back-coupled timer circuit 602 may further include a timer NCO adder circuit 606 (a first input of which is coupled to the timer NCO register 604), a modulus circuit 608 configured to generate a modulus $M_{tim}$ ($M_{tim}$ being a predefined integer value) value for an input value, and a delay circuit 610 configured to delay a signal applied to its input by exactly one clock cycle, symbolized in FIG. 6 by $z^{-1}$. An output of the delay circuit 610 may be back-coupled to a second input of the timer NCO adder circuit 606. Thus, the ratio between the amended target RF PLL circuit division value $I_{tim}$ and the predefined integer value $M_{tim}$ together with the hardware clock signal defines the characteristic of the signal $A_{tim}$ provided at the output of the delay circuit 610. An example characteristic 752 of the signal $A_{tim}$ (for an exemplary modulus $M_{tim}=5$ and an exemplary amended target RF PLL circuit division value $I_{tim}=1$) is shown in FIG. 7 in a sixth timing diagram 750.

Referring back to FIG. 6, the output of the timer NCO adder circuit 606 may be coupled to the input of the modulus circuit 608 as well as to a wrap circuit 612 configured to generate an output signal changing its state for every wrapping event of the back-coupled timer circuit 602 as shown in a fifth timing diagram 740 and a sixth timing diagram 750 in FIG. 7, for example. The output of the wrap circuit 612 may be coupled to an input of a further delay circuit 614 configured to delay a signal applied to its input by exactly one clock cycle. The output signal $W_{tim}$ of the further delay circuit 614 may be coupled to the clock input of the counter circuit 380. An example characteristic 742 of the signal $W_{tim}$ is shown in FIG. 7 in the fifth timing diagram 740.

As also shown in FIG. 6, the fractional decimation NCO 376,616 may also be implemented as a back-coupled fractional decimation circuit. As described above, the value resulting from the sum of the fractional decimation division value correction signal 402 and the target fractional decimation NCO division value $R_{fdec\_nom}$ (the sum may be referred to as amended target fractional decimation NCO division value $I_{fdec}$) may be stored in the second register or, alternatively, another register, which may be referred to as fractional decimation NCO register 618. Illustratively, the amended target fractional decimation NCO division value $I_{fdec}$ may be understood as an integer value which defines an increment value by which the fractional decimation NCO accumulator is incremented with every input signal cycle, in other words, it is data driven, namely by means of the valid signal 354. The back-coupled fractional decimation circuit 616 may further include a fractional decimation NCO adder circuit 620 (a first input of which is coupled to the fractional decimation NCO register 618), a further modulus circuit 622 configured to generate a modulus $M_{fdec}$ ($M_{fdec}$ being a predefined integer value) value for an input value, and a fractional decimation delay circuit 624 configured to delay a signal applied to its input by exactly one clock cycle. Illustratively, the fractional decimation delay circuit 624, which may be implemented as a register, will be updated only in case the valid signal 354 is logic "1". The update of the signal $A_{fdec}$ will be visible at the output with the next HW cycle (in the exemplary implementation of a synchronously clocked flip flop circuit, for example).

An output of the fractional decimation delay circuit 624 may be back-coupled to a second input of the fractional decimation NCO adder circuit 620. Thus, the ratio between the amended target fractional decimation NCO division value $I_{fdec}$ and the predefined integer value $M_{fdec}$ together with the valid signal 354 defines the characteristic of the signal $A_{fdec}$ provided at the output of the fractional decimation delay circuit 624. An example characteristic 732 of the signal $A_{fdec}$ (for an exemplary modulus $M_{fdec}=5$ and an exemplary amended target fractional decimation NCO division value $I_{fdec}$) is shown in FIG. 7 in a fourth timing diagram 730. It is to be noted that the sampled version of the characteristic 732 of the signal $A_{fdec}$ is shown in characteristic 734. As mentioned above, the updated value of the signal $A_{fdec}$ will be visible at the output with the next HW cycle.

Referring again back to FIG. 6, the output of the fractional decimation NCO adder circuit 620 may be coupled to the input of the further modulus circuit 622 as well as to a further wrap circuit 626 configured to generate an output signal changing its state for every wrapping event of the back-coupled fractional decimation circuit 616 as shown in a third timing diagram 720 and in a fourth timing diagram 730 in FIG. 7, for example. The output of the further wrap circuit 626 may be coupled to an input of a further fractional decimation delay circuit 628 configured to delay a signal applied to its input by exactly one clock cycle of the valid signal 354. The output signal $W_{fdec}$ of the further fractional decimation delay circuit 628 may be coupled to the baseband modem 206 and to the data path. An example characteristic 722 of the signal $W_{fdec}$ is shown in FIG. 7 in the third timing diagram 720.

Furthermore, FIG. 7 shows, in a second timing diagram 710, a characteristic of the valid signal Val 354 provided by the integer decimation circuit 328.

As also shown in FIG. 6, the feedback control circuit 338 may include a sensor circuit 630 and a filter circuit 632 coupled downstream to the sensor circuit 630.

The sensor circuit 630 may include three inputs:
a first input coupled to the output of the delay circuit 610 and configured to receive the signal $A_{tim}$,
a second input coupled to the output of the fractional decimation delay circuit 624 and configured to receive the signal $A_{fdec}$, and
a third input coupled to the second signal output 356 of the integer decimation circuit 328.

The sensor circuit 630 may further include a logic AND gate 634, a first sensor register 636, a second sensor register 638, and a delta phase determination circuit 640. The logic AND gate 634 provides a sampling activation signal in accordance with which the sensor circuit 630 detects the then current value $S_{tim}$ of the signal $A_{tim}$ (and stores it in the first sensor register 636) and the then current value $S_{fdec}$ of the signal $A_{fdec}$ (and stores it in the second sensor register 638). A first input of the AND gate 634 is coupled to the second signal output 356 of the integer decimation circuit 328 and a second input of the AND gate 634 receives a Gate signal 642 which is generated by the firmware (not shown) of the circuit arrangement 300, for example. Thus, illustratively, the firmware may schedule the timing of the sampling of the signals $A_{tim}$, $A_{fdec}$. When the AND gate 634 outputs a logic "high" ("1") signal, the signals $A_{tim}$, $A_{fdec}$ are sampled and the respectively sampled values $S_{tim}$, $S_{fdec}$, are stored in the sensor registers 636, 638. The delta phase determination circuit 640 may be configured to read the sampled values $S_{tim}$, $S_{fdec}$ from the sensor registers 636, 638 and to calculate a phase difference between them. The determined phase difference values may be provided to the (optional) filter circuit 632, which may be configured to apply a suitable filter function to the time sequence of the determined phase difference values and may apply the filtering result to the second adder circuit 404 as the fractional decimation division value correction signal 402.

It is to be noted that in this implementation, the timer NCO 378 acts as the master and the fractional decimation NCO 376 acts as the slave. However, it is to be noted that in various aspects of this disclosure, the fractional decimation NCO 376 may act as the master and the timer NCO 378 may act as the slave. The feedback control loop would be amended accordingly in that case.

Thus, illustratively, the fractional decimation NCO 376 may provide the signal $A_{fdec}$ representing the phase of the input sampling instant with respect to the output sampling period. A phase of zero ("0") degrees of the signal $A_{fdec}$ means that the input sampling instant coincides with a tick on the output sampling grid. A phase of 180 degrees of the signal $A_{fdec}$ means that an input sample arrives in the middle between two ticks of the output sampling grid. The timer NCO 378 may be updated every HW cycle, it may act as the master. The fractional decimation NCO 376 may be updated every input valid strobe, it may act as slave. Furthermore, a timer NCO wrap (e.g. the wrap circuit 612) may increase the timer counter circuit 380. A fractional decimation NCO wrap (e.g. the further wrap circuit 626) may trigger a new fractional decimation output sample (e.g. $W_{fdec}$). The respective NCO frequency may be defined as the average number of NCO wraps. The respective NCO frequency may be controlled via modulus and increment, as described above. Moreover, the NCOs may have equal nominal frequencies $f_{tim}=f_{fdec}$. When the state variables or signals $A_{tim}$ and $A_{fdec}$ shall be sampled for delta phase measurement, this may be triggered by the valid strobe Val (e.g. the valid signal 354) to ensure a defined relation between the timer NCO 378 and the fractional decimation NCO 376. The sampling may be timed by the firmware (not shown) of the circuit arrangement 300 via the Gate signal 642 applied to the AND gate 634. The firmware (not shown) of the circuit arrangement 300 may further be configured to fetch (in other words read) the sampled state variables or sampled values $S_{tim}$, $S_{fdec}$ from the sensor registers 636, 638, to compute a correction to the nominal fractional decimation increment value and to update the value stored in the fractional decimation NCO register 618 accordingly.

In the following, the timing diagrams of FIG. 7 will be explained in more detail. In this explanation, it will be assumed that the NCO-PLL shall be in open loop mode, i.e. no correction is applied to the fractional decimation NCO 376. Furthermore, it is assumed that the timer NCO 378 is updated every HW cycle. An $S_{fdec}$ characteristic 734 over time is illustrated in the fourth timing diagram 730. An $S_{tim}$ characteristic 754 over time is illustrated in the sixth timing diagram 750. In this example, it is further assumed that the Gate signal 642 of the AND gate 634 is permanently active, i.e. the sampled values $S_{tim}$ and $S_{fdec}$ are updated every Val strobe, in other words with every raising edge of the valid signal 354, for example. Furthermore, it is assumed that the NCO states repeat periodically every P (P being a predefined integer value, for example) HW cycles. Both NCOs 376, 378 may wrap three times per P, i.e. $f_{tim}=f_{fdec}$ applies. The values of the signals $A_{tim}$ and $A_{fdec}$ can be understood as samples from a first envelope characteristic 756 (see sixth timing diagram 750 in FIG. 7) and a second envelope characteristic 736 (see fourth timing diagram 730 in FIG. 7), respectively. As can be seen from FIG. 7, the delta phase $D=S_{fdec}-S_{tim}$ does not drift in this example, but just toggles between two values due to the wrapping. In case the wrapping is corrected, D would remain constant. This is because $f_{tim}=f_{fdec}$ applies.

In the following, various aspects of this disclosure will be illustrated:

Example 1 is a circuit arrangement. The circuit arrangement may include an analog-to-digital-converter (ADC) configured to convert an analog signal into a digitized signal having an ADC frequency and a decimation circuit configured to provide a first signal having a sampling frequency based on the digitized radio signal having the ADC frequency. The sampling frequency is smaller than the ADC frequency. The circuit arrangement may further include a timer circuit providing a second signal having a timer frequency and a timing control signal to control the timing of the decimation circuit, and a difference determination circuit configured to determine a phase difference between the second signal and the first signal.

In Example 2, the subject matter of Example 1 can optionally include that the circuit arrangement further includes a feedback control circuit configured to adjust the phase difference between the second signal and the first signal to a predefined value.

In Example 3, the subject matter of Example 2 can optionally include that the feedback control circuit is configured to adjust at least one of the timer circuit or the decimation circuit to provide the phase difference of the second signal and the first signal with the predefined value.

In Example 4, the subject matter of any one of Examples 2 or 3 can optionally include that the predefined value is zero.

In Example 5, the subject matter of any one of Examples 1 to 4 can optionally include that the timer circuit includes a timer numerically controlled oscillator providing the second signal having the timer frequency.

In Example 6, the subject matter of Example 5 can optionally include that the timer circuit further includes a counter coupled to the timer numerically controlled oscillator. The timer circuit may further include a comparator coupled to the counter. The second signal may be the clock signal of the counter. The comparator may be configured to generate the timing control signal based on a signal provided by the counter.

In Example 7, the subject matter of any one of Examples 5 or 6 can optionally include that the timer numerically controlled oscillator is implemented in software.

In Example 8, the subject matter of any one of Examples 1 to 7 can optionally include that the decimation circuit includes a decimation numerically controlled oscillator providing the first signal having the sampling frequency.

In Example 9, the subject matter of any one of Examples 1 to 8 can optionally include that the decimation circuit includes a fractional decimation circuit configured to provide the first signal having the sampling frequency.

In Example 10, the subject matter of Example 9 can optionally include that the decimation circuit further includes an integer decimation circuit. The integer decimation circuit is configured to receive the digitized radio signal and to provide an intermediate signal to the fractional decimation circuit.

In Example 11, the subject matter of any one of Examples 2 to 10 can optionally include that the feedback control circuit includes a sensor configured to measure a current phase difference between the second signal and the first signal.

In Example 12, the subject matter of Example 11 can optionally include that the feedback control circuit further includes a filter coupled downstream to the sensor and configured to determine at least one phase regulation signal to regulate at least one of the phase of the first signal or the phase of the second signal.

In Example 13, the subject matter of any one of Examples 1 to 12 can optionally include that the circuit arrangement further includes a baseband circuit configured to demodulate the first signal provided by the decimation circuit.

In Example 14, the subject matter of Example 13 can optionally include that the baseband circuit is configured to receive a signal having a fixed predefined frequency.

In Example 15, the subject matter of any one of Examples 1 to 14 can optionally include that the circuit arrangement further includes an oscillator circuit configured to provide a local oscillator signal having a local oscillator frequency, and a mixer configured to mix a radio frequency signal with the local oscillator signal to provide the analog signal.

In Example 16, the subject matter of Example 15 can optionally include that the oscillator circuit further includes a fractional phase locked loop circuit configured to generate an ADC clock signal using the local oscillator signal having the local oscillator frequency to clock the analog-to-digital-converter, the ADC clock signal having the ADC frequency.

In Example 17, the subject matter of any one of Examples 1 to 16 can optionally include that the oscillator circuit includes a quartz oscillator crystal.

In Example 18, the subject matter of Example 17 can optionally include that the oscillator circuit further includes a multiplier circuit configured to generate the local oscillator signal based on an oscillator signal provided by the quartz oscillator crystal.

In Example 19, the subject matter of any one of Examples 17 or 18 can optionally include that the oscillator circuit further includes an integer phase locked loop circuit configured to generate an ADC clock signal to clock the analog-to-digital-converter, the ADC clock signal having the ADC frequency.

In Example 20, the subject matter of any one of Examples 17 or 18 can optionally include that the oscillator circuit further includes a fractional phase locked loop circuit configured to generate an ADC clock signal to clock the analog-to-digital-converter, the ADC clock signal having the ADC frequency.

Example 21 is a circuit arrangement adapted for clock synchronization and signal conversion used in a mobile radio communication device. The circuit arrangement may include an analog-to-digital-converter (ADC) configured to convert an analog signal into a digitized signal having an ADC frequency, and a decimation circuit configured to provide a first signal having a sampling frequency based on the digitized radio signal having the ADC frequency. The sampling frequency is smaller than the ADC frequency. The circuit arrangement may further include a timer circuit providing a second signal having a timer frequency and a timing control signal to control the timing of the decimation circuit, and a difference determination circuit configured to determine a frequency difference between the timer frequency and the sampling frequency.

In Example 22, the subject matter of Example 21 can optionally include that the circuit arrangement further includes a feedback control circuit configured to adjust at least one of the timer frequency or the sampling frequency so that the timer frequency and the sampling frequency are aligned.

In Example 23, the subject matter of Example 22 can optionally include that the feedback control circuit is configured to adjust at least one of the timer circuit or the decimation circuit to provide the frequency difference of the second signal and the first signal with the predefined value.

In Example 24, the subject matter of Example 23 can optionally include that the predefined value is zero.

In Example 25, the subject matter of any one of Examples 21 to 24 can optionally include that the timer circuit includes a timer numerically controlled oscillator providing the second signal having the timer frequency.

In Example 26, the subject matter of Example 25 can optionally include that the timer circuit further includes a counter coupled to the timer numerically controlled oscillator. The timer circuit may further include a comparator coupled to the counter. The second signal may be the clock signal of the counter. The comparator may be configured to generate the timing control signal based on a signal provided by the counter.

In Example 27, the subject matter of any one of Examples 25 or 26 can optionally include that the timer numerically controlled oscillator is implemented in software.

In Example 28, the subject matter of any one of Examples 21 to 27 can optionally include that the decimation circuit includes a decimation numerically controlled oscillator providing the first signal having the sampling frequency.

In Example 29, the subject matter of any one of Examples 21 to 28 can optionally include that the decimation circuit includes a fractional decimation circuit configured to provide the first signal having the sampling frequency.

In Example 30, the subject matter of Example 29 can optionally include that the decimation circuit further includes an integer decimation circuit. The integer decimation circuit may be configured to receive the digitized radio signal and to provide an intermediate signal to the fractional decimation circuit.

In Example 31, the subject matter of any one of Examples 22 to 30 can optionally include that the feedback control circuit includes a sensor configured to measure a current phase difference between the second signal and the first signal.

In Example 32, the subject matter of Example 31 can optionally include that the feedback control circuit further includes a filter coupled downstream to the sensor and configured to determine at least one phase regulation signal to regulate at least one of the phase of the first signal or the phase of the second signal.

In Example 33, the subject matter of any one of Examples 21 to 32 can optionally include that the circuit arrangement further includes a baseband circuit configured to demodulate the first signal provided by the decimation circuit.

In Example 34, the subject matter of Example 33 can optionally include that the baseband circuit is configured to receive a signal having a fixed predefined frequency.

In Example 35, the subject matter of any one of Examples 21 to 34 can optionally include that the circuit arrangement further includes an oscillator circuit configured to provide a local oscillator signal having a local oscillator frequency, and a mixer configured to mix a radio frequency signal with the local oscillator signal to provide the analog signal.

In Example 36, the subject matter of Example 35 can optionally include that the oscillator circuit further includes a fractional phase locked loop circuit configured to generate an analog-to-digital converter clock signal using the local oscillator signal having the local oscillator frequency to clock the analog-to-digital-converter, the analog-to-digital converter clock signal having the analog-to-digital converter frequency.

In Example 37, the subject matter of any one of Examples 21 to 36 can optionally include that the oscillator circuit includes a quartz oscillator crystal.

In Example 38, the subject matter of Example 37 can optionally include that the oscillator circuit further includes a multiplier circuit configured to generate the local oscillator signal based on an oscillator signal provided by the quartz oscillator crystal.

In Example 39, the subject matter of any one of Examples 37 or 38 can optionally include that the oscillator circuit further includes an integer phase locked loop circuit configured to generate an analog-to-digital converter clock signal to clock the analog-to-digital-converter, the analog-to-digital converter clock signal having the analog-to-digital converter frequency.

In Example 40, the subject matter of any one of Examples 37 or 38 can optionally include that the oscillator circuit further includes a fractional phase locked loop circuit configured to generate an analog-to-digital converter clock signal to clock the analog-to-digital-converter, the analog-to-digital converter clock signal having the analog-to-digital converter frequency.

Example 41 is a mobile radio communication device. The mobile radio communication device may include a radio frequency circuit, and a circuit arrangement of any one of Examples 1 to 40.

In Example 42, the subject matter of Example 41 can optionally include that the mobile radio communication device is configured as a mobile radio communication terminal device.

Example 43 is a method of processing an analog signal. The method may include analog-to-digital-converting an analog signal into a digitized signal having an analog-to-digital converter (ADC) frequency, providing, by a decimation circuit, a first signal having a sampling frequency based on the digitized radio signal having the ADC frequency, wherein the sampling frequency is smaller than the ADC frequency, providing, by a timer circuit, a second signal having a timer frequency and a timing control signal to control the timing of the decimation circuit, and determining a phase difference between the second signal and the first signal.

In Example 44, the subject matter of Example 43 can optionally include that the method further includes feedback controlling the phase difference between the second signal and the first signal to a predefined value.

In Example 45, the subject matter of Example 44 can optionally include that the feedback controlling includes controlling at least one of the timer circuit or the decimation circuit to provide the phase difference of the second signal and the first signal to the predefined value.

In Example 45, the subject matter of Example 45 can optionally include that the predefined value is zero.

In Example 47, the subject matter of any one of Examples 43 to 46 can optionally include that the timer circuit includes a timer numerically controlled oscillator providing the second signal having the timer frequency.

In Example 48, the subject matter of Example 47 can optionally include that the timer circuit further includes a counter coupled to the timer numerically controlled oscillator. The timer circuit may further include a comparator coupled to the counter. The second signal may be the clock signal of the counter. The comparator may generate the timing control signal based on a signal provided by the counter.

In Example 49, the subject matter of any one of Examples 47 or 48 can optionally include that the timer numerically controlled oscillator is implemented in software.

In Example 50, the subject matter of any one of Examples 43 to 49 can optionally include that the decimation circuit includes a decimation numerically controlled oscillator providing the first signal having the sampling frequency.

In Example 51, the subject matter of any one of Examples 43 to 50 can optionally include that the decimation circuit includes a fractional decimation circuit providing the first signal having the sampling frequency.

In Example 52, the subject matter of Example 51 can optionally include that the decimation circuit further includes an integer decimation circuit. The integer decimation circuit receives the digitized radio signal and provides an intermediate signal to the fractional decimation circuit.

In Example 53, the subject matter of any one of Examples 44 to 52 can optionally include that the feedback controlling includes measuring a current phase difference between the second signal and the first signal.

In Example 54, the subject matter of Example 53 can optionally include that the feedback controlling further includes providing a filter coupled downstream to the sensor, the filter determining at least one phase regulation signal to regulate at least one of the phase of the first signal or the phase of the second signal.

In Example 55, the subject matter of any one of Examples 43 to 54 can optionally include that the method further includes demodulating, by a baseband circuit, the first signal provided by the decimation circuit.

In Example 56, the subject matter of Example 55 can optionally include that the baseband circuit receives a signal having a fixed predefined frequency.

In Example 57, the subject matter of any one of Examples 43 to 56 can optionally include that the method further includes providing, by an oscillator circuit, a local oscillator signal having a local oscillator frequency, and mixing a radio frequency signal with the local oscillator signal to provide the analog signal.

In Example 58, the subject matter of Example 57 can optionally include that the oscillator circuit further includes a fractional phase locked loop circuit generating an analog-to-digital converter (ADC) clock signal using the local oscillator signal having the local oscillator frequency to clock the analog-to-digital-converter, the ADC clock signal having the ADC frequency.

In Example 59, the subject matter of any one of Examples 43 to 58 can optionally include that the oscillator circuit includes a quartz oscillator crystal.

In Example 60, the subject matter of Example 59 can optionally include that the oscillator circuit further includes a multiplier circuit generating the local oscillator signal based on an oscillator signal provided by the quartz oscillator crystal.

In Example 61, the subject matter of any one of Examples 59 or 60 can optionally include that the oscillator circuit further includes an integer phase locked loop circuit generating an ADC clock signal to clock the analog-to-digital-converter, the ADC clock signal having the ADC frequency.

In Example 62, the subject matter of any one of Examples 59 or 60 can optionally include that the oscillator circuit further includes a fractional phase locked loop circuit generating an ADC clock signal to clock the analog-to-digital-converter, the ADC clock signal having the ADC frequency.

Example 63 is a method of processing an analog signal. The method may include analog-to-digital-converting an analog signal into a digitized signal having an analog-to-digital converter (ADC) frequency, providing, by a decimation circuit, a first signal having a sampling frequency based on the digitized radio signal having the ADC frequency, wherein the sampling frequency is smaller than the ADC frequency, providing, by a timer circuit, a second signal having a timer frequency and a timing control signal to control the timing of the decimation circuit, and determining a frequency difference between the timer frequency and the sampling frequency.

In Example 64, the subject matter of Example 63 can optionally include that the method further includes feedback controlling least one of the timer frequency or the sampling frequency so that the timer frequency and the sampling frequency are aligned.

In Example 65, the subject matter of Example 64 can optionally include that the feedback controlling includes controlling at least one of the timer circuit or the decimation circuit to provide the frequency difference of the second signal and the first signal with the predefined value.

In Example 66, the subject matter of Example 65 can optionally include that the predefined value is zero.

In Example 67, the subject matter of any one of Examples 63 to 66 can optionally include that the timer circuit includes a timer numerically controlled oscillator providing the second signal having the timer frequency.

In Example 68, the subject matter of Example 67 can optionally include that the timer circuit further includes a counter coupled to the timer numerically controlled oscillator. The timer circuit may further include a comparator coupled to the counter. The second signal may be the clock signal of the counter. The comparator may generate the timing control signal based on a signal provided by the counter.

In Example 69, the subject matter of any one of Examples 67 or 68 can optionally include that the timer numerically controlled oscillator is implemented in software.

In Example 70, the subject matter of any one of Examples 63 to 69 can optionally include that the decimation circuit includes a decimation numerically controlled oscillator providing the first signal having the sampling frequency.

In Example 71, the subject matter of any one of Examples 63 to 70 can optionally include that the decimation circuit includes a fractional decimation circuit providing the first signal having the sampling frequency.

In Example 72, the subject matter of Example 71 can optionally include that the decimation circuit further includes an integer decimation circuit. The integer decimation circuit receives the digitized radio signal and provides an intermediate signal to the fractional decimation circuit.

In Example 73, the subject matter of any one of Examples 64 to 72 can optionally include that the feedback controlling includes measuring a current phase difference between the second signal and the first signal.

In Example 74, the subject matter of Example 73 can optionally include that the feedback controlling further includes providing a filter coupled downstream to the sensor and determining at least one phase regulation signal to regulate at least one of the phase of the first signal or the phase of the second signal.

In Example 75, the subject matter of any one of Examples 63 to 74 can optionally include that the method further includes demodulating, by a baseband circuit, the first signal provided by the decimation circuit.

In Example 76, the subject matter of Example 75 can optionally include that the baseband circuit receives a signal having a fixed predefined frequency.

In Example 77, the subject matter of any one of Examples 63 to 76 can optionally include that the method further includes providing, by an oscillator circuit, a local oscillator signal having a local oscillator frequency, and mixing a radio frequency signal with the local oscillator signal to provide the analog signal.

In Example 78, the subject matter of Example 77 can optionally include that the oscillator circuit further includes a fractional phase locked loop circuit generating an ADC clock signal using the local oscillator signal having the local oscillator frequency to clock the analog-to-digital-converter, the ADC clock signal having the ADC frequency.

In Example 79, the subject matter of any one of Examples 63 to 78 can optionally include that the oscillator circuit includes a quartz oscillator crystal.

In Example 80, the subject matter of Example 79 can optionally include that the oscillator circuit further includes a multiplier circuit generating the local oscillator signal based on an oscillator signal provided by the quartz oscillator crystal.

In Example 81, the subject matter of any one of Examples 79 or 80 can optionally include that the oscillator circuit further includes an integer phase locked loop circuit generating an ADC clock signal to clock the analog-to-digital-converter, the ADC clock signal having the ADC frequency.

In Example 82, the subject matter of any one of Examples 79 or 80 can optionally include that the oscillator circuit further includes a fractional phase locked loop circuit generating an ADC clock signal to clock the analog-to-digital-converter, the ADC clock signal having the ADC frequency.

In Example 83, the subject matter of any one of Examples 63 to 82 can optionally include that the method performed by a mobile radio communication device.

In Example 84, the subject matter of Example 83 can optionally include that the method is performed by a mobile radio communication terminal device.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A circuit arrangement, comprising:
an analog-to-digital-converter (ADC) configured to convert an analog signal into a digitized radio signal having an ADC frequency;
a decimation circuit configured to provide a first signal having a sampling frequency based on the digitized radio signal having the ADC frequency, wherein the sampling frequency is smaller than the ADC frequency; wherein the decimation circuit comprises a numerically controlled oscillator for providing the first signal having the sampling frequency; a timer circuit providing a second signal having a timer frequency and an integer decimation enable signal to control the timing of the decimation circuit; and
a feedback control circuit configured to determine a phase difference between the second signal and the first signal;
wherein the decimation circuit comprises a first decimation circuit arranged in a first clock domain and a second decimation circuit arranged in a second clock domain; and
wherein the first decimation circuit or the second decimation circuit comprises a fractional decimation circuit configured to provide the first signal having the sampling frequency.

2. The circuit arrangement of claim 1, further comprising:
a feedback control circuit configured to adjust the phase difference between the second signal and the first signal to a predefined value.

3. The circuit arrangement of claim 2,
wherein the feedback control circuit is configured to adjust at least one of the timer circuit or the decimation circuit to provide the phase difference of the second signal and the first signal with the predefined value.

4. The circuit arrangement of any one of claims 2,
wherein the feedback control circuit comprises a sensor configured to measure a current phase difference between the second signal and the first signal.

5. The circuit arrangement of claim 1,
wherein the timer circuit comprises a timer numerically controlled oscillator providing the second signal having the timer frequency.

6. The circuit arrangement of claim 1,
wherein the decimation circuit comprises a decimation numerically controlled oscillator providing the first signal having the sampling frequency.

7. The circuit arrangement of claim 1, further comprising:
a baseband circuit configured to demodulate the first signal provided by the decimation circuit.

8. The circuit arrangement of claim 7,
wherein the baseband circuit is configured to receive a signal having a fixed predefined frequency.

9. A circuit arrangement adapted for clock synchronization and signal conversion used in a mobile radio communication device, the circuit arrangement comprising:
an analog-to-digital-converter (ADC) configured to convert an analog signal into a digitized radio signal having an ADC frequency;
a decimation circuit configured to provide a first signal having a sampling frequency based on the digitized radio signal having the ADC frequency, wherein the sampling frequency is smaller than the ADC frequency; wherein the decimation circuit comprises a numerically controlled oscillator for providing the first signal having the sampling frequency;
a timer circuit providing a second signal having a timer frequency and an integer decimation enable signal to control the timing of the decimation circuit;
a feedback control circuit configured to determine a frequency difference between the timer frequency and the sampling frequency;
a feedback control circuit configured to adjust at least one of the timer frequency or the sampling frequency so that the timer frequency and the sampling frequency are aligned;
wherein the feedback control circuit is configured to adjust at least one of the timer circuit or the decimation circuit to provide the frequency difference of the second signal and the first signal with a predefined value; and
wherein the feedback control circuit comprises a sensor configured to measure a current phase difference between the second signal and the first signal.

10. The circuit arrangement of claim 9,
wherein the timer circuit comprises a timer numerically controlled oscillator providing the second signal having the timer frequency.

11. The circuit arrangement of claim 9,
wherein the decimation circuit comprises a decimation numerically controlled oscillator providing the first signal having the sampling frequency.

12. The circuit arrangement of claim 9,
wherein the decimation circuit comprises a fractional decimation circuit configured to provide the first signal having the sampling frequency.

13. The circuit arrangement of claim 9, further comprising:
a baseband circuit configured to demodulate the first signal provided by the decimation circuit.

14. The circuit arrangement of claim 13,
wherein the baseband circuit is configured to receive a signal having a fixed predefined frequency.

15. A mobile radio communication device, comprising:
a radio frequency circuit; and
a circuit arrangement, comprising:
an analog-to-digital-converter (ADC) configured to convert an analog signal into a digitized radio signal having an ADC frequency;
a decimation circuit configured to provide a first signal having a sampling frequency based on the digitized radio signal having the ADC frequency,
wherein the sampling frequency is smaller than the ADC frequency;
wherein the decimation circuit comprises a numerically controlled oscillator for providing the first signal having the sampling frequency;
wherein the decimation circuit comprises a first decimation circuit arranged in a first clock domain and a second decimation circuit arranged in a second clock domain; a timer circuit providing a second signal having a timer frequency and an integer decimation enable signal to control the timing of the decimation circuit; and a feedback control configured to determine a phase difference between the second signal and the first signal;

wherein the first decimation circuit or the second decimation circuit comprises a fractional decimation circuit configured to provide the first signal having the sampling frequency.

16. The mobile radio communication device of claim 15, configured as a mobile radio communication terminal device.

* * * * *